United States Patent
Wang et al.

(10) Patent No.: US 7,662,981 B2
(45) Date of Patent: Feb. 16, 2010

(54) LEVELER COMPOUNDS

(75) Inventors: Deyan Wang, Hudson, MA (US);
Robert D. Mikkola, Grafton, MA (US);
Chunyi Wu, Shrewsbury, MA (US);
George G. Barclay, Jefferson, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 12/322,090

(22) Filed: Jan. 29, 2009

(65) Prior Publication Data

US 2009/0139873 A1 Jun. 4, 2009

Related U.S. Application Data

(62) Division of application No. 11/182,311, filed on Jul. 16, 2005, now Pat. No. 7,510,639.

(51) Int. Cl.
*C07D 303/12* (2006.01)
(52) U.S. Cl. ..................................... 549/556
(58) Field of Classification Search ................. 564/253; 549/556
See application file for complete search history.

(56) References Cited

U.S. PATENT DOCUMENTS

| | | |
|---|---|---|
| 3,320,317 A | 5/1967 | Rogers et al. |
| 3,843,667 A | 10/1974 | Cupery |
| 4,038,161 A | 7/1977 | Eckles et al. |
| 4,336,114 A | 6/1982 | Mayer et al. |
| 4,347,108 A | 8/1982 | Willis |
| 4,376,685 A | 3/1983 | Watson |
| 4,555,315 A | 11/1985 | Barbieri et al. |
| 5,051,154 A | 9/1991 | Bernards et al. |
| 5,252,196 A | 10/1993 | Sonnenberg et al. |
| 5,607,570 A | 3/1997 | Rohbani |
| 5,972,192 A | 10/1999 | Dubin et al. |
| 6,024,857 A | 2/2000 | Reid |
| 6,183,622 B1 | 2/2001 | Janik |
| 6,425,966 B1 | 7/2002 | Highsmith et al. |
| 6,444,110 B2 | 9/2002 | Barstad et al. |
| 6,610,192 B1 | 8/2003 | Step et al. |
| 6,800,188 B2 | 10/2004 | Hagiwara et al. |
| 2003/0010646 A1 | 1/2003 | Toben et al. |
| 2004/0249177 A1 | 12/2004 | Wang et al. |

FOREIGN PATENT DOCUMENTS

| | | |
|---|---|---|
| DE | 196 43 091 A1 | 4/1998 |
| EP | 1 069 211 A2 | 1/2001 |
| EP | 1 148 156 A2 | 10/2001 |
| WO | WO 99/31300 | 6/1999 |

*Primary Examiner*—Taofiq A Solola
(74) *Attorney, Agent, or Firm*—John J. Piskorski

(57) ABSTRACT

Plating baths containing a mixture of leveling agents, where the mixture includes a first level agent having a first diffusion coefficient and a second leveling agent having a second diffusion coefficient, are provided. Such plating baths deposit a metal layer, particularly a copper layer, that is substantially planar across a range of electrolyte concentrations. Methods of depositing metal layers using such plating baths are also disclosed. These baths and methods are useful for providing a planar layer of copper on a substrate having small apertures, such as an electronic device.

4 Claims, 3 Drawing Sheets

Comparative

Comparative

LEVELER COMPOUNDS

The present invention relates generally to the field of electrolytic plating compositions. In particular, the present invention relates to the field of copper electroplating compositions.

Methods for electroplating articles with metal coatings generally involve passing a current between two electrodes in a plating solution where one of the electrodes is the article to be plated. A typical acid copper plating solution comprises dissolved copper (usually copper sulfate), an acid electrolyte such as sulfuric acid in an amount sufficient to impart conductivity to the bath, and proprietary additives to improve the uniformity of the plating and the quality of the metal deposit. Such additives include brighteners, levelers, surfactants, suppressors, and the like.

Electrolytic copper plating solutions are used for many industrial applications. For example, they are used in the automotive industry to deposit base layers for subsequently applied decorative and corrosion protective coatings. They are also used in the electronics industry, particularly for the fabrication of printed circuit boards and semiconductors. For circuit board fabrication, copper is electroplated over selected portions of the surface of a printed circuit board and onto the walls of through holes passing between the surfaces of the circuit board base material. The walls of a through hole are first metallized to provide conductivity between the board's circuit layers. For semiconductor fabrication, copper is electroplated over the surface of a wafer containing a variety of features such as vias, trenches or a combination thereof. The vias and trenches are metallized to provide conductivity between various layers of the semiconductor device.

It is well known in certain areas of plating, such as in electroplating of printed circuit boards, that the use of brighteners and/or levelers in the electroplating bath can be crucial in achieving a uniform metal deposit on a substrate surface. Plating a substrate having irregular topography can pose particular difficulties. During electroplating a voltage drop variation typically will exist along an irregular surface which can result in an uneven metal deposit. Plating irregularities are exacerbated where the voltage drop variation is relatively extreme, i.e., where the surface irregularity is substantial. As a result, a thicker metal deposit, termed overplating, is observed over such surface irregularities. Consequently, high quality metal plating (e.g., a metal layer or plate of substantially uniform thickness) is frequently a challenging step in the manufacture of electronic devices. Leveling agents are often used in copper plating baths to provide substantially uniform, or level, copper layers in electronic devices. For example, U.S. Pat. No. 6,610,192 (Step et al.) discloses a method of producing level copper deposits by electroplating copper from a copper plating bath containing one or more leveling agents, wherein at least one leveling agent is a reaction product of a heterocyclic amine with an epihalohydrin. Even with such leveling agents, level and smooth copper deposits are not always produced, particularly when lower acid plating conditions (i.e. $\leq 0.6$ M electrolyte) are employed. In particular, mounding can be a problem. "Mounding" refers to the excess plating (or overplating) of a metal such as copper over an aperture. Such mounding makes subsequent planarization of the device more difficult. Further, as the geometries of electronic devices get smaller, the difficulty of plating a uniform copper layer while completely filling the smaller features becomes more difficult.

There remains a need in the art for leveling agents for use in semiconductor manufacture that do not form voids, show reduced overplating such as mounding, provide smooth and level deposits over a variety of feature sizes and using a variety of electrolyte concentrations.

It has been surprisingly found that the present invention provides metal layers, particularly copper layers, having reduced overplating. The metal layers provided by the present invention are substantially level, even on substrates having very small features and on substrates having a variety of feature sizes. Such substantially level metal layers are provided from plating baths having a wide range of electrolyte concentration. It has been further surprisingly found that the present invention provides metal layers substantially without the formation of defects such as voids in the features, particularly in very small features. The present invention also provides copper deposits having a smooth surface, i.e. a low surface roughness. These advantages are achieved using a leveling agent mixture including at least two leveling agents wherein the at least two leveling agents have different mobilities.

The present invention provides an electroplating bath including a source of copper ions, an electrolyte, and a leveling agent mixture, the leveling agent mixture including a first leveling agent having a first mobility and a second leveling agent having a second mobility, wherein the first mobility is less than the second mobility, and wherein the leveling agent mixture has a polydispersity of $\geq 2.5$. The mixture of leveling agents is capable of providing a substantially level copper layer and filling variously sized features without substantially forming defects.

Also provided by the present invention is a method of depositing copper on a substrate including the steps of: contacting a substrate to be plated with copper with the copper plating bath described above; and then applying a current density for a period of time sufficient to deposit a copper layer on the substrate. Particularly suitable substrates are those used in the manufacture of electronic devices. Accordingly, the present invention provides a method of manufacturing an electronic device including the steps of: contacting an electronic device substrate with the copper plating bath described above; and then applying a current density for a period of time sufficient to deposit a copper layer on the substrate.

The present invention further provides a reaction product of a compound including a heteroatom chosen from nitrogen, sulfur and a mixture of nitrogen and sulfur, with a polyepoxide compound containing an ether linkage. Such reaction products are particularly useful as leveling agents in metal plating baths, such as copper plating baths.

Figure 4A:
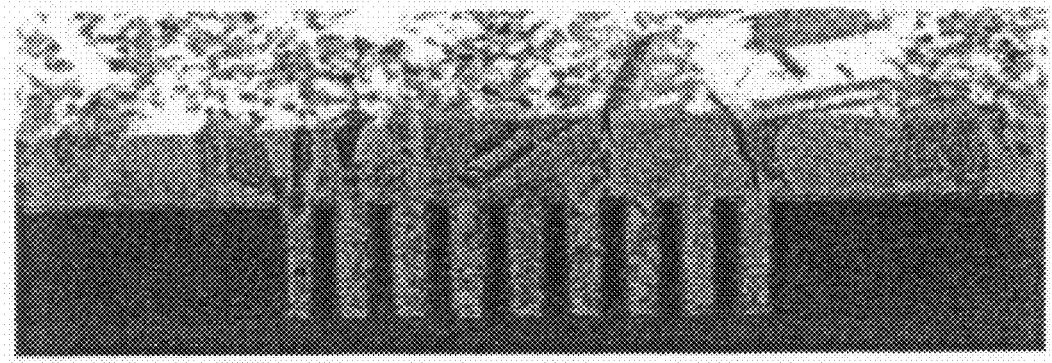
Figure 4B:
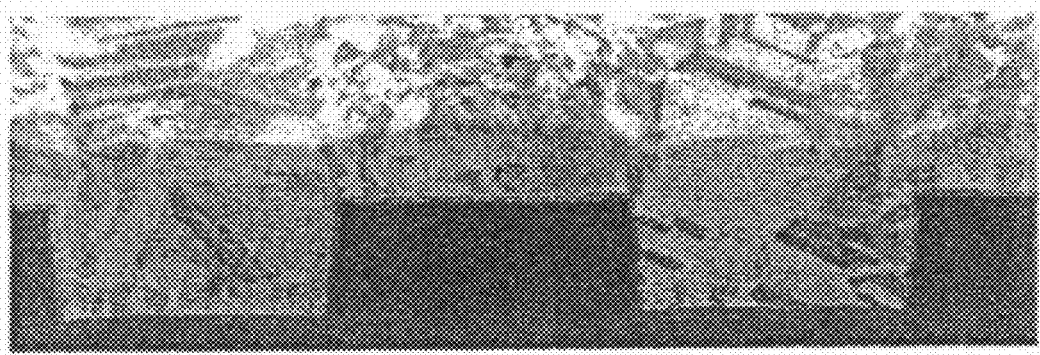

FIGS. 4A and 4B are SEMs of a copper layer plated over 0.2 and 2 μm trenches, respectively, using a leveling agent mixture of the invention As used throughout this specification, the following abbreviations shall have the following meanings, unless the context clearly indicates otherwise: A=amperes; mA/cm$^2$=milliamperes per square centimeter; ° C.=degrees Centigrade; g=gram; mg=milligram; Å=angstrom; L=liter, ppm=parts per million; ppb=parts per billion; μm=micron=micrometer; cm=centimeter; RPM=revolutions per minute; DI=deionized; AR=aspect ratio; Mn=number average molecular weight; and mL=milliliter. All amounts are percent by weight and all ratios are molar ratios, unless otherwise noted. All numerical ranges are inclusive and combinable in any order, except where it is clear that such numerical ranges are constrained to add up to 100%.

As used throughout the specification, "feature" refers to the geometries on a substrate. "Apertures" refer to recessed features, such as vias and trenches. The term "small features" refers to features that are one micron or smaller in size. "Very small features" refers to features that are one-half micron or smaller in size. Likewise, "small apertures" refer to apertures that are one micron or smaller ($\leqq 1$ μm) in size and "very small apertures" refer to apertures that are one-half micron or smaller ($\leqq 0.5$ μm) in size. As used throughout this specification, the term "plating" refers to metal electroplating, unless the contekt clearly indicates otherwise. "Deposition" and "plating" are used interchangeably throughout this specification. "Halide" refers to fluoride, chloride, bromide and iodide. Likewise, "halo" refers to fluoro, chloro, bromo and iodo. The term "alkyl" includes linear, branched and cyclic alkyl. "Brightener" refers to an organic additive that increases the plating rate of the electroplating bath. A "suppressor" refers to an organic additive that suppresses the plating rate of a metal during electroplating. "Leveler" refers to an organic compound that is capable of providing a substantially level (or planar) metal layer. The terms "levelers" and "leveling agents" are used interchangeably throughout this specification. The articles "a" and "an" refer to the singular and the plural.

The present invention provides an essentially level plated metal layer, particularly a plated copper layer, on a substrate. When the substrate contains small features, the plated metal layer of this invention has reduced overplating as compared to conventionally plated metal layers and the metal deposited in the small features is substantially free of voids, and preferably free of voids. "Overplating" refers to a thicker metal deposit over dense aperture areas as compared to areas free of apertures or at least containing relatively few apertures. The term "relatively few apertures" means an area containing up to 10%, and preferably up to 5%, of the total number of apertures of a comparative area having many such apertures, "dense aperture areas", within the same device.

Any substrate upon which a metal, particularly copper, can be electroplated is useful in the present invention. Such substrates include, but are not limited to, electronic devices such as printed wiring boards, integrated circuits, semiconductor packages, lead frames and interconnects. Particularly useful substrates are any used in the manufacture of electronic devices, such as integrated circuits, and more particularly wafers used in dual damascene manufacturing processes. Such substrates typically contain a number of features, particularly apertures, having a variety of sizes. For example, integrated circuit substrates may contain apertures ranging from 100 μm to as little as 50 nm, 25 nm, 18 nm or smaller. Small features may be present in the substrate along with relatively larger features, such as 100 μm features. For example, an integrated circuit substrate may contain 0.01 μm or smaller as well as 2 μm or even larger features. It will be appreciated by those skilled in the art that other substrates to be plated, such as lead frames and printed wiring boards, may have larger or smaller features or no features at all. The present invention is particularly suitable for filling apertures, of varying aspect ratios, such as low aspect ratio vias and high aspect ratio apertures. By "low aspect ratio" is meant an aspect ratio of from 0.1:1 to 4:1. The term "high aspect ratio" refers to aspect ratios of greater than 4:1, such as 10:1 or 20:1.

The present invention is achieved by using a metal plating bath, particularly a copper plating bath, including a mixture of leveling agents, such mixture including a first leveling agent having a first mobility and a second leveling agent having a second mobility, wherein the first mobility is less than the second mobility, and wherein the leveling agent mixture has a polydispersity of $\geqq 2.5$. Such metal plating bath is typically aqueous and includes a source of metal ions, such as copper ions, and an electrolyte. Typically, the copper plating bath includes one or more of a brightener and a suppressor. Optionally, the plating bath may contain a halide ion.

The difference in mobilities of the leveling agents allows the leveling agent mixture to be selected to provide a level metal deposit and substantially void-free metal filled apertures. Such selection of mobilities is within the ability of those skilled in the art. "Mobility" refers to the ability of a leveling agent to move to and from a surface of the metal being deposited. The mobility of a leveling agent is a function of the charge density of the compound and the diffusion coefficient of the compound. The charge density of the present leveling agents is expressed as the number of charges (in acidic media) per molecular weight ("mol. wt.") of each component composing the repeating unit in the leveling agent. For example, for a 1:1 reaction product of imidazole with epichlorohydrin, the components composing the repeating unit, imidazole (mol. wt.=68) and epichlorohydrin (mol. wt.=92) have a combined molecular weight of 160, and the repeating unit has one charge in an acidic plating bath, providing a charge density of $1/160$. While not wishing to be bound by theory, it is believed that increasing the number of charges per molecular weight of repeating unit typically enhances interactions between the leveling agent and the growing metal deposit. As such interactions increase, the mobility of the leveling agent decreases. Thus, increasing the charge density in a leveling agent decreases the mobility of that leveling agent.

The diffusion coefficient of the present leveling agents is related to their hydrodynamic volume. Hydrodynamic volume may be estimated by the molecular weight of a leveling agent. Leveling agents having a relatively larger molecular weight are expected to have a larger hydrodynamic volume as compared to leveling agents having a relatively smaller molecular weight. In general, the larger the hydrodynamic volume, i.e. the higher the molecular weight, the lower the diffusion coefficient of a leveling agent. Leveling agents having a relatively lower diffusion coefficient are less mobile than leveling agents having a relatively higher diffusion coefficient. Thus, the mobility of a leveling agent can be increased by decreasing the charge density, decreasing the hydrodynamic volume or by both decreasing the charge density and decreasing the hydrodynamic volume. Likewise, the mobility of a leveling agent may be decreased by increasing the charge density, increasing the hydrodynamic volume or by both increasing the charge density and increasing the hydrodynamic volume.

As used herein, the term "polydispersity" is defined as the weight average molecular weight ("Mw") of all leveling agent species divided by the number average molecular weight ("Mn") of all leveling agent species. Molecular weights may be determined using any conventional technique, such as end group analysis, ebulliometry, cryoscopy, osmometry, gel-permeation chromatography ("GPC"), and light scattering. See, e.g. F. W. Billmeyer, *Textbook of Polymer Science*, $2^{nd}$ ed., Wiley-Interscience, New York, 1971, pp 62-96, for a description of such techniques.

Compounds capable of providing a level copper deposit, i.e. levelers, are well-known in the art. While not intending to be bound by theory, it is believed such levelers are attracted to copper surfaces by strong, but not irreversible, attractions. Such attractions are believed to include coordinative interactions, electrostatic interactions or both. In general, compounds capable of providing a level copper deposit are those containing one or more heteroatoms chosen from sulfur, nitrogen and a combination of sulfur and nitrogen.

Leveling agents may be polymeric or non-polymeric. Suitable polymeric leveling agents include, without limitation, polyethylenimine, polyamidoamines and reaction products of an amine with an epoxide. Such amines may be primary, secondary or tertiary alkyl amines, aryl amines or may be heterocyclic amines. Exemplary amines include, but are not limited to, dialkylamines, trialkylamines, arylalkylamines, diarylamines, imidazole, triazole, tetrazole, benzimidazole, benzotriazole, piperidine, morpholine, piperazine, pyridine, oxazole, benzoxazole, pyrimidine, quonoline, and isoquinoline. Imidazole and pyridine are particularly suitable. Any epoxy group-containing compound that can react with the amine is suitable as the epoxide. Suitable epoxides include, but are not limited to, epihalohydrin such as epichlorohydrin and epibromohydrin, and polyepoxide compounds. Particularly suitable polyepoxide compounds are those having 2 or more epoxide moieties joined together by an ether-containing linkage. Exemplary polyepoxide compounds are those of formula (I)

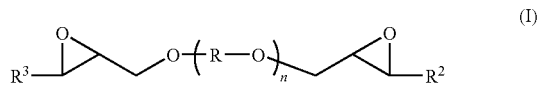

(I)

wherein R is ($C_1$-$C_{10}$)alkyl; and $R^2$ and $R^3$ are independently chosen from H and R, wherein n=1-20. Typically, n=1-10 and more typically n=1-5. In one embodiment, n=1. In a further embodiment, $R^2$ and $R^3$ are both H. In another embodiment, R is optionally substituted. By "substituted" it is meant that one or more hydrogens are replaced with one or more substituent groups, such as hydroxyl, ($C_1$-$C_4$)alkoxy, thiol, amino, ($C_1$-$C_4$)alkylamino, and di($C_1$-$C_4$)alkylamino. While the polyepoxide compounds of formula (I) have two epoxy groups, it will be appreciated by those skilled in the art that polyepoxide compounds having three or more epoxy groups may be used.

Exemplary compounds of formula (I) include, without limitation, 1,4-butanediol diglycidyl ether, ethylene glycol diglycidyl ether, diethylene glycol diglycidyl ether, triethylene glycol diglycidyl ether, glycerol diglycidyl ether, neopentyl glycol diglycidyl ether, propylene glycol diglycidyl ether, dipropylene glycol diglycidyl ether, and poly(propylene-glycol) diglycidyl ether. A suitable poly(propylene glycol) diglycidyl ether is one having a number average molecular weight of 380. Such polyepoxide compounds are generally available from a variety of sources, such as Aldrich (Milwaukee, Wis.), and may be used without further purification.

It will be appreciated that derivatives of polyethylenimines and polyamidoamines may be used as leveling agents in the present invention. Such derivatives include, without limitation, reaction products of a polyethylenimine with an epoxide and reaction products of a polyamidoamine with an epoxide.

Suitable reaction products of amines with epoxides are those disclosed in U.S. Pat. Nos. 3,320,317; 4,038,161; 4,336,114; and 6,610,192. The preparation of the reaction products of certain amines and certain epoxides are well known, see, e.g., U.S. Pat. No. 3,320,317 and German Patent App. No. DE 196 43 091. In one method, the amine such as imidazole and epoxide such as epichlorohydrin are dissolved in the same solvent in desired concentrations and reacted, such as for 20 to 240 minutes. The solvent is typically removed, such as under vacuum, to provide the reaction product. In a further embodiment, the solution is stirred and the temperature of the solution may be from ambient to the reflux temperature of water (100° C.). Alternatively, the epichlorohydrin may be added slowly while the reaction mixture is heated, such as from 40° to 95° C., to increase the rate of the reaction. Higher or lower temperatures may be used at this stage. The reaction mixture is maintained at this temperature until the pH of the reaction mixture is in the range of 7 to 8. Typically, this reaction is complete within 1 to 24 hours and preferably 8 to 16 hours. The exact reaction time will depend upon the particular reactants selected, the concentration of the reactants in the reaction mixture and the particular temperatures are used. The reaction products typically have a molar ratio of amine to epoxide of 10:1 to 1:4, and more typically from 2:1 to 1:2.

Reaction products of amines with the polyepoxides of formula (I) can be prepared by dissolving a desired amount of the amine in water and heating the solution to approximately 40 to 90° C. with stirring. The polyepoxide compound is then added to the solution with continued stirring. Following addition of the polyepoxide compound, the reaction mixture is heated to approximately 75 to 95° C. for 4 to 8 hours. After stirring for 12 to 18 hours, the reaction mixture is then diluted with water and the pH is adjusted to a value of approximately 7.

In one embodiment, at least one leveling agent in the present mixture is a reaction product of an amine with an epihalohydrin. Typically, the amine is imidazole and the epihalohydrin is epichlorohydrin. However, other epihalohydrins such as epibromohydrin may be used. In another embodiment, at least one leveling agent in the present mixture is a reaction product of an amine with a polyepoxide compound. In a further embodiment, the amine is imidazole and the polyepoxide compound is a diepoxide compound of formula (I).

Exemplary reaction products of a compound including a heteroatom chosen from nitrogen, sulfur and a mixture of nitrogen and sulfur, with a polyepoxide compound containing an ether linkage compounds of formula (I) have a number average molecular weight (as determined by gel permeation chromatography) of 500 to 25,000, although such reaction products having other number average molecular weights may be used. More typically, such reaction products have a number average molecular weight of 1000 to 15,000 and still more typically from 1250 to 5000. In general, the reaction products of a heteroatom chosen from nitrogen, sulfur and a mixture of nitrogen and sulfur, with a polyepoxide compound containing an ether linkage compounds of formula (I) have a molecular weight polydispersity of 1 to 5, more typically 1 to 4 and still more typically 1 to 2.5. In one embodiment, the polydispersity is from 1 to 2.

Suitable non-polymeric leveling agents include, without limitation, non-polymeric sulfur-containing and non-polymeric nitrogen-containing compounds. Exemplary sulfur-containing leveling compounds include thiourea and substituted thioureas. Exemplary nitrogen-containing compounds include primary, secondary and tertiary amines. Such amines may be alkyl amines, aryl amines, and cyclic amines (i.e. cyclic compounds having a nitrogen as a member of the ring). Suitable amines include, but are not limited to, dialkylamines, trialkylamines, arylalkylamines, diarylamines, imidazole, triazole, tetrazole, benzimidazole, benzotriazole, piperidine, morpholine, piperazine, pyridine, oxazole, benzoxazole, pyrimidine, quonoline, isoquinoline, and the like. Imidazole and pyridine are particularly suitable. The non-polymeric amines may be unsubstituted or substituted. By "substituted", it is meant that one or more of the hydrogens are replaced by one or more substituent groups. A wide variety of substituent groups may be used, including amino, alkylamino, dialkylamino, alkyl, aryl, alkenyl, alkoxyl, and halo. Other suitable non-polymeric leveling agents include nigrosines, pentamethyl-para-rosaniline hydrohalide, hexamethyl-para-rosaniline hydrohalide and compounds containing a functional group of the formula N—R—S, where R is a substituted alkyl, unsubstituted alkyl, substituted aryl or unsubstituted aryl. Typically, the alkyl groups are $(C_1$-$C_6)$alkyl and preferably $(C_1$-$C_4)$alkyl. In general, the aryl groups include $(C_6$-$C_{20})$aryl, preferably $(C_6$-$C_{10})$aryl. Such aryl groups may further include heteroatoms, such as sulfur, nitrogen and oxygen. It is preferred that the aryl group is phenyl or napthyl.

It will be appreciated by those skilled in the art that a leveling agent of the present invention may also possess functionality capable of acting as a suppressor. Such compounds may be dual-functioning, i.e. they may function as leveling agents and as suppressors.

The mixture of leveling agents used in the present invention includes a first leveling agent having a first mobility and a second leveling agent having a second mobility, wherein the first mobility is less than the second mobility, and wherein the leveling agent mixture has a polydispersity of $\geq 2.5$. As discussed above, mobility is a function of the charge density and the diffusion coefficient of the particular leveling agent. In general, the first leveling agent has a charge density of $1/70$ to $1/250$, and typically from $1/100$ to $1/200$. In one embodiment, the first leveling agent has a molecular weight, which is related to diffusion coefficient, in the range of 50 to 10,000. In another embodiment, the first leveling agent has a weight average molecular weight in the range of 1,000 to 7,500, more typically 1,500 to 7,000, and still more typically 1,500 to 5,000. The second leveling agent generally has a charge density of $1/100$ to $1/500$, typically from $1/200$ to $1/500$, and more typically from $1/200$ to $1/400$. In a further embodiment, the second leveling agent has a weight average molecular weight in the range of 300 to 50,000, typically 1000 to 30,000, more typically from 2,500 to 25,000 and still more typically from 3,000 to 15,000. The molecular weights of the leveling agents are determined by GPC against a calibration curve of a series of polyethylene glycol standards ranging in molecular weight from 106 to 168,000. Particularly suitable first leveling agents are reaction products of imidazole with epichlorohydrin. Particularly suitable second leveling agents are reaction products of imidazole with a polyepoxide compound of formula (I). No particular difference in mobilitites between the first and second leveling agents is required. What is required is that there be a difference in the mobilities of the first and second leveling agents.

The mixture of leveling agents of the present invention has a polydispersity of $\geq 2.5$. Typically, the leveling agent mixture has a polydispersity of $\geq 3$, more typically $\geq 4$, and still more typically $\geq 5$. It will be appreciated by those skilled in the art that the leveling agent mixture of the present invention may be composed only of a single polymeric composition having a polydispersity $\geq 2.5$. Such a polymer composition will possess species having sufficiently different molecular weights, and therefore sufficiently different diffusion coefficients, to provide at least two species having different mobilities. It will be further appreciated by those skilled in the art that polymer compositions having a polydispersity of $\geq 2.5$ may admixed with an additional leveling agent. As used herein, the term "polymer" refers to compounds having more than one repeating unit and having a molecular weight of $\geq 100$ and includes dimers, trimers and oligomers. Thus, components of the polymeric levelers having a molecular weight of <100 were not considered in the calculation of polydispersities.

The amount of leveling agents used in the metal electroplating baths will depend upon the particular leveling agents selected, the concentration of the metal ions in the electroplating bath, the particular electrolyte used, the concentration of the electrolyte and the current density applied. In general, the total amount of leveling agents in the electroplating bath is from 0.5 ppm to 10,000 ppm based on the total weight of the plating bath, although greater or lesser amounts may be used. Typically, the total amount of leveling agents is from 1 to 5000 ppm and more typically from 5 to 1000 ppm.

The leveling agents useful in the present invention are generally commercially available or may be prepared by methods known in the literature. Such leveling agents may be used as is or may be further purified.

Any metal ion source that is at least partially soluble in the electroplating bath and which metal can be deposited electrolytically is suitable. Typically, the metal ion source is soluble in the plating bath. Suitable metal ion sources are metal salts and include without limitation metal sulfates, metal halides, metal acetates, metal nitrates, metal fluoroborates, metal alkylsulfonates, metal arylsulfonates, metal sulfamates, and metal gluconates. In one embodiment, the metal is copper. Suitable sources of copper ions include, but are not limited to, copper sulfate, copper chloride, copper acetate, copper nitrate, copper fluoroborate, copper methane sulfonate, copper phenyl sulfonate, copper phenol sulfonate and copper p-toluene sulfonate. Copper sulfate pentahydrate is particularly suitable. Mixtures of metal ion sources may be used, such as, for example, a mixture of a tin ion source and a copper ion source. Such mixtures of metal ion sources are useful in the deposition of metal alloys. Such metal salts are generally commercially available and may be used without further purification.

The metal salts may be used in the present invention in any amount that provides sufficient metal ions for electroplating on a substrate. When the metal is copper, the copper salt is typically present in an amount sufficient to provide an amount of copper metal of 10 to 180 g/L of plating solution. Alloys, such as copper-tin, for example, copper having up to 2% by weight tin, may be advantageously plated according to the present invention. Other suitable copper alloys include, but are not limited to copper-silver, tin-copper-silver, and tin-copper-bismuth. The amount of each of the metal salts in such mixtures depends upon the particular alloy to be plated and is well known to those skilled in the art.

The electrolyte useful in the present invention may be alkaline or acidic. Suitable acidic electrolytes include, but are not limited to, sulfuric acid, acetic acid, fluoroboric acid, alkanesulfonic acids such as methanesulfonic acid, ethanesulfonic acid, propanesulfonic acid and trifluoromethane sulfonic acid, arylsulfonic acids such as phenyl sulfonic acid, phenol sulfonic acid and toluene sulfonic acid, sulfamic acid, hydrochloric acid, and phosphoric acid. Mixtures of acids may be advantageously used in the present metal plating baths. Preferred acids include sulfuric acid, methanesulfonic acid, ethanesulfonic acid, propanesulfonic acid, and mixtures thereof. Such electrolytes are generally commercially available from a variety of sources and may be used without further purification. The acids are typically present in an amount in the range of from 1 to 300 g/L, more typically from 5 to 250 g/L, and still more typically from 10 to 180 g/L. In one embodiment, a low amount of added acid is used. By "low acid" is meant that the total amount of added acid in the electrolyte is less than or equal to 40 g/L, and typically less than or equal to 35 g/L.

Such electrolytes may optionally contain a source of halide ions, such as chloride ions such as copper chloride or hydrochloric acid. A wide range of halide ion concentrations may be used in the present invention. Typically, the halide ion concentration is in the range of from 0 to 100 ppm based on the plating bath, and preferably from 10 to 75 ppm. A particularly useful amount of halide ion is 20 to 75 ppm and more particularly 20 to 50 ppm. Such halide ion sources are generally commercially available and may be used without further purification.

Any brighteners (also referred to as brightening agents) are suitable for use in the present invention. Such brighteners are well-known to those skilled in the art. Typical brighteners contain one or more sulfur atoms and have a molecular weight of 1000 or less. Brightener compounds that have sulfide and/or sulfonic acid groups are generally preferred, particularly compounds that include a group of the formula R'—S—R—SO$_3$X, where R is optionally substituted alkyl, optionally substituted heteroalkyl, optionally substituted aryl, or optionally substituted heterocyclic; X is a counter ion such as sodium or potassium; and R' is hydrogen or a chemical bond. Typically, the alkyl groups are $(C_1-C_{16})$alkyl and preferably $(C_3-C_{12})$alkyl. Heteroalkyl groups typically have one or more heteroatoms, such as nitrogen, sulfur or oxygen, in the alkyl chain. Suitable aryl groups include, but are not limited to, phenyl, benzyl, biphenyl and naphthyl. Suitable heterocyclic groups typically contain from 1 to 3 heteroatoms, such as nitrogen, sulfur or oxygen, and 1 to 3 separate or fused ring systems. Such heterocyclic groups may be aromatic or non-aromatic. Specific brighteners suitable for use in the present invention include, but are not limited to, N,N-dimethyl-dithiocarbamic acid-(3-sulfopropyl)ester; 3-mercapto-propylsulfonic acid-(3-sulfopropyl)ester; 3-mercapto-propyl-sulfonic acid sodium salt; carbonic acid-dithio-o-ethylester-s-ester with 3-mercapto-1-propane sulfonic acid potassium salt; bis-sulfopropyl disulfide; 3-(benzothiazolyl-s-thio)propyl sulfonic acid sodium salt; pyridinium propyl sulfobetaine; 1-sodium-3-mercaptopropane-1-sulfonate; N,N-dimethyl-dithiocarbamic acid-(3-sulfoethyl)ester; 3-mercapto-ethyl propylsulfonic acid-(3-sulfoethyl)ester; 3-mercapto-ethylsulfonic acid sodium salt; carbonic acid-dithio-o-ethylester-s-ester with 3-mercapto-1-ethane sulfonic acid potassium salt; bis-sulfoethyl disulfide; 3-(benzothiazolyl-s-thio)ethyl sulfonic acid sodium salt; pyridinium ethyl sulfobetaine; and 1-sodium-3-mercaptoethane-1-sulfonate.

Such brighteners may be used in a variety of amounts. In general, brighteners are used in an amount of at least 1 mg/L, based on the bath, typically at least 1.2 mg/L, and more typically at least 1.5 mg/L. For example, the brighteners are present in an amount of from 1 mg/L to 200 mg/L. Particularly suitable amounts of brightener useful in the present invention are at least 2 mg/L, and more suitably at least 4 g/L. Even higher brightener concentrations are suitable, such as at least 10, 15, 20, 30, 40 or 50 mg/L, based on the bath. A particularly useful range of such brightener concentrations is from 5 to 50 mg/L.

Any compound capable of suppressing the metal plating rate may be used as a suppressor in the present electroplating baths. Suitable suppressors include, but are not limited to, polymeric materials, particularly those having heteroatom substitution, and more particularly oxygen substitution. Exemplary suppressors are high molecular weight polyethers, such as those of the formula:

R—O—(CXYCX'Y'O)$_n$R' where R and R' are independently chosen from H, $(C_2-C_{20})$ alkyl group and $(C_6-C_{10})$aryl group; each of X, Y, X' and Y' is independently selected from hydrogen, alkyl such as methyl, ethyl or propyl, aryl such as phenyl, or aralkyl such as benzyl; and n is an integer from 5 to 100,000. Typically, one or more of X, Y, X' and Y' is hydrogen. Particularly suitable suppressors include commercially available polypropylene glycol copolymers and polyethylene glycol copolymers, including ethylene oxide-propylene oxide ("EO/PO") copolymers and butyl alcohol-ethylene oxide-propylene oxide copolymers. Suitable butyl alcohol-ethylene oxide-propylene oxide copolymers are those having a weight average molecular weight of 1800. When such suppressors are used, they are typically present in an amount in the range of from 1 to 10,000 ppm based on the weight of the bath, and preferably from 5 to 10,000 ppm.

Particularly suitable compositions useful as electroplating baths in the present invention include a soluble copper salt, an acid electrolyte, a mixture of leveling agents, a brightener and a suppressor. More particularly, suitable compositions include 10 to 180 g/L of a soluble copper salts as copper metal, 5 to 250 g/L of acid electrolyte, 5 to 50 mg/L of a brightener, 1 to 10,000 ppm of a suppressor, 15 to 75 ppm of a halide ion, and 1 to 5000 ppm of a mixture of leveling agents having a first leveler having a first diffusion coefficient and a second leveler having a second diffusion coefficient, wherein the first diffusion coefficient is less than the second diffusion coefficient.

The electroplating baths of the present invention may be prepared by combining the components in any order. It is preferred that the inorganic components such as metal salts, water, electrolyte and optional halide ion source, are first added to the bath vessel followed by the organic components such as leveling agents, brighteners, suppressors, surfactants and the like.

Typically, the plating baths of the present invention may be used at any temperature from 10° to 65° C. or higher. It is preferred that the temperature of the plating baths is from 100 to 35° C. and more preferably from 150 to 30° C.

In general, when the present invention is used to deposit metal on a substrate such as a wafer used in the manufacture of an integrated circuit, the plating baths are agitated during use. Any suitable agitation method may be used with the present invention and such methods are well-known in the art. Suitable agitation methods include, but are not limited to, air sparging, work piece agitation, impingement and the like. Such methods are known to those skilled in the art. When the present invention is used to plate an integrated circuit substrate, such as a wafer, the wafer may be rotated such as from 1 to 150 RPM and the plating solution contacts the rotating wafer, such as by pumping or spraying. In the alternative, the wafer need not be rotated where the flow of the plating bath is sufficient to provide the desired metal deposit.

Typically, substrates are electroplated by contacting the substrate with the plating baths of the present invention. The substrate typically functions as the cathode. The plating bath contains an anode, which may be soluble or insoluble. Potential is typically applied to the cathode. Sufficient current density is applied and plating performed for a period of time sufficient to deposit a metal layer, such as a copper layer, having a desired thickness on the substrate. Suitable current densities, include, but are not limited to, the range of 1 to 250 mA/cm². Typically, the current density is in the range of 1 to 60 mA/cm² when used in the manufacture of integrated circuits. The specific current density depends upon the substrate to be plated, the leveling agent selected and the like. Such current density choice is within the abilities of those skilled in the art.

The present invention is useful for depositing a metal layer, particularly a copper layer, on a variety of substrates, particularly those having variously sized apertures. Accordingly, the present invention provides a method of depositing a metal layer such as copper on a substrate including the steps of: contacting a substrate to be plated with copper with a copper plating bath; and then applying a current density for a period of time sufficient to deposit a copper layer on the substrate, wherein the copper plating bath includes a source of copper ions, an acid electrolyte and a mixture of leveling agents including a first leveling agent having a first mobility and a second leveling agent having a second mobility, wherein the first mobility is less than the second mobility, and wherein the leveling agent mixture has a polydispersity of $\geq 2.5$. For example, the present invention is particularly suitable for depositing copper on integrated circuit substrates, such as semiconductor devices, with small diameter vias, trenches or other apertures. In one embodiment, semiconductor devices are plated according to the present invention. Such semiconductor devices include, but are not limited to, wafers used in the manufacture of integrated circuits.

Metal, particularly copper, is deposited in apertures according to the present invention without substantially forming voids within the metal deposit. By the term "without substantially forming voids", it is meant that >95% of the plated apertures are void-free. It is preferred that the plated apertures are void-free.

While the process of the present invention has been generally described with reference to semiconductor manufacture, it will be appreciated that the present invention may be useful in any electrolytic process where an essentially level or planar copper deposit having high reflectivity is desired, and where reduced overplating and metal filled small features that are substantially free of voids are desired. Such processes include printed wiring board manufacture. For example, the present plating baths may be useful for the plating of vias, pads or traces on a printed wiring board, as well as for bump plating on wafers. Other suitable processes include packaging and interconnect manufacture. Accordingly, suitable substrates include lead frames, interconnects, printed wiring boards, and the like.

An advantage of the present invention is that overplating, particularly mounding, is reduced or substantially eliminated. Such reduced overplating means less time and effort is spent in removing metal, such as copper, during subsequent chemical-mechanical polishing ("CMP") processes, particularly in semiconductor manufacture. A further advantage of the present invention is that a wide range of apertures sizes may be filled within a single substrate with substantially no suppressed local plating. Thus, the present invention is particularly suitable to substantially filling apertures in a substrate having a variety of aperture sizes, such as from 0.01 μm to 100 μm or even larger.

A still further advantage of the present electroplating baths is that they provide metal deposits having less surface roughness and higher reflectivity, as measured by atomic force microscopy ("AFM"), as compared to conventional leveling agents. For example, layers of copper deposited from the present plating baths have an arithmetic average roughness ("Ra") of $\leq 5$ nm and preferably <5 nm. These copper layers also have a low Z-value, such as $\leq 70$, typically $\leq 60$ and more typically $\leq 55$. The "Z-value" is the difference in heights in nm of the average of the 10 highest and 10 lowest points examined. The lower the Z-value, the more uniform the surface of the copper layer. Further, the copper layers deposited using the present plating baths typically have a root mean square roughness ("Rs") of approximately 6 nm or less.

Figure 1A:
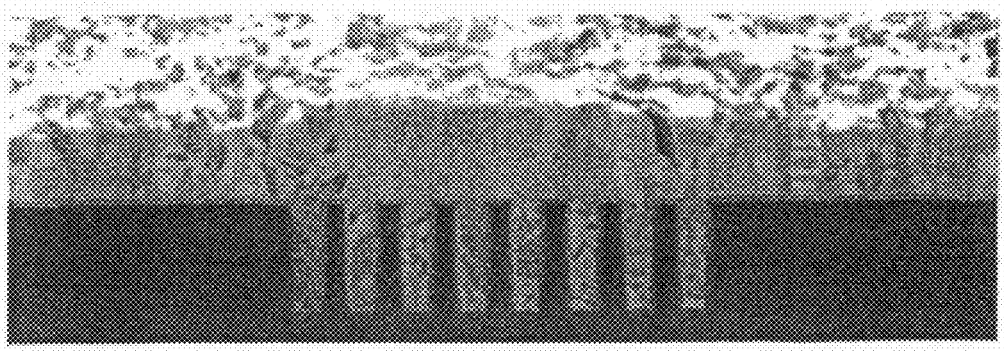
FIGS. 1A and 1B are scanning electron micrographs ("SEMs") of a copper layer plated over 0.18 and 2 μm trenches, respectively, using a single leveling agent having a high molecular weight.
Figure 1B:
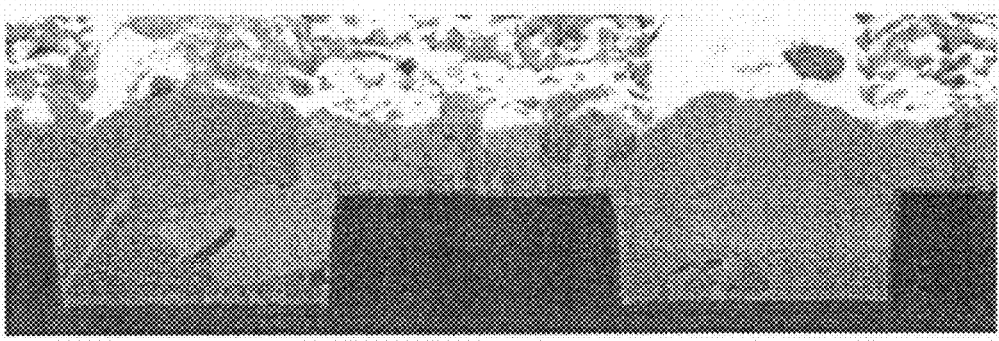
Figure 2A:
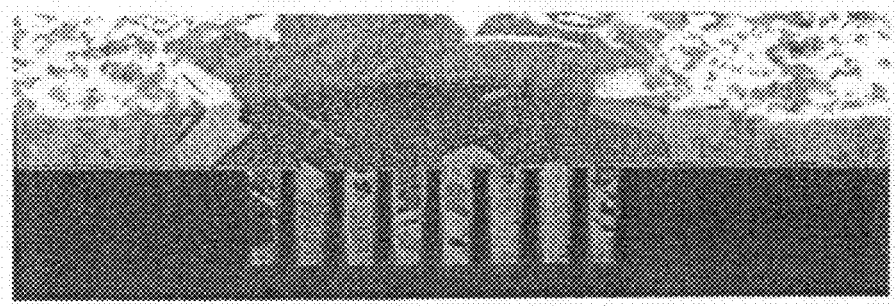
FIGS. 2A and 2B are SEMs of a copper layer plated over 0.18 and 2 μm trenches, respectively, using a single leveling agent having a low molecular weight.
Figure 2B:
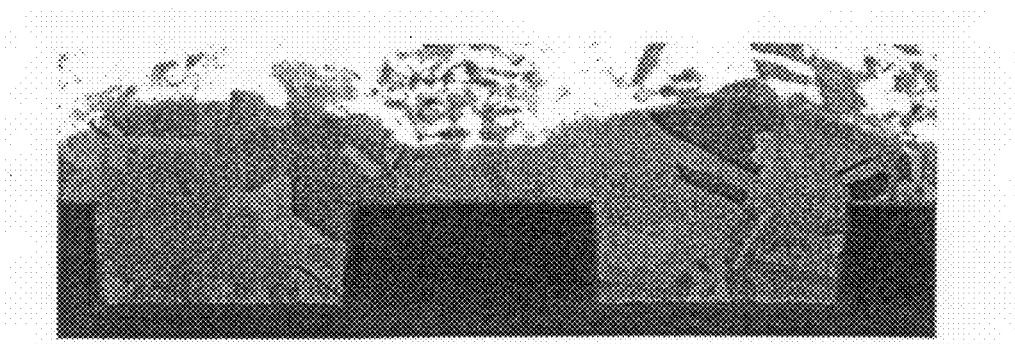
Figure 3A:
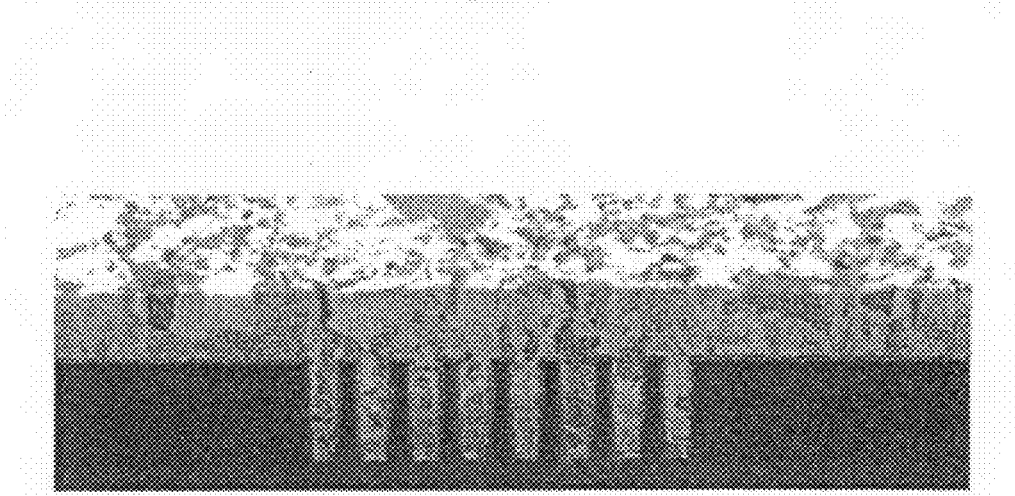
FIGS. 3A and 3B are SEMs of a copper layer plated over 0.18 and 2 μm trenches, respectively, using a leveling agent mixture of the invention.
Figure 3B:
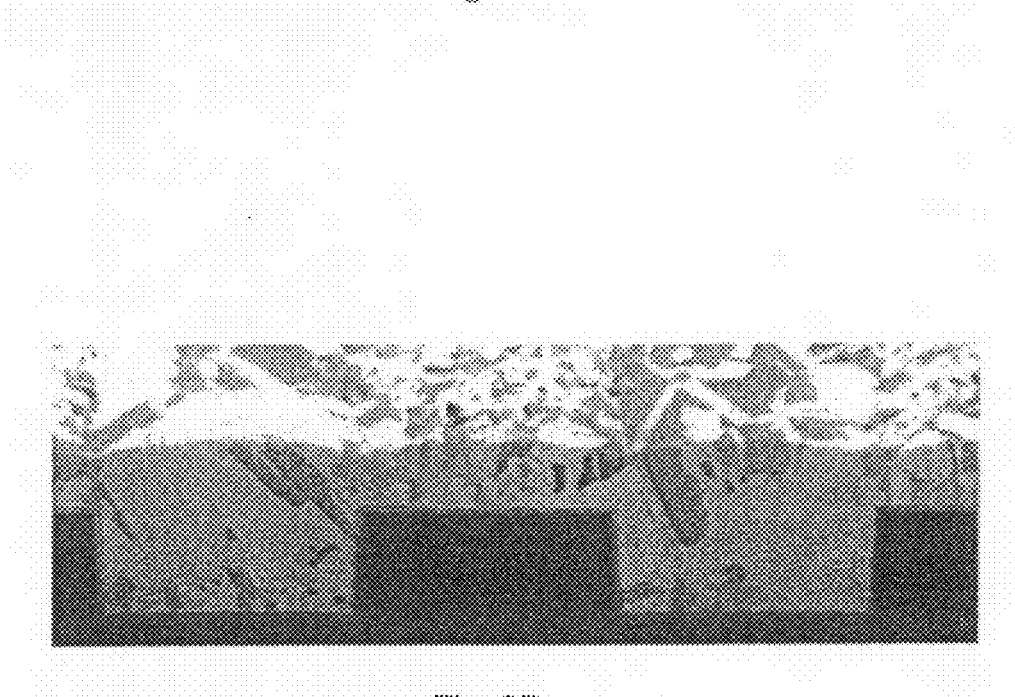

The present compounds provide level metal deposits over a wide range of feature sizes. For example, FIGS. 1A and 1B are SEMs showing a layer of copper plated over 0.18 μm and 2 μm trenches, respectively, using a plating bath containing a single polymeric leveling agent having a polydispersity of <2.5 and a Mw of approximately 14,000. FIGS. 2A and 2B are SEMs showing a layer of copper plated over 0.18 μm and 2 μm trenches, respectively, using a copper plating bath containing as a single leveling agent a reaction product of imidazole with a diepoxide compound, the leveling agent having a polydispersity <2.5 and a Mw of approximately 4,000. FIGS. 3A and 3B are SEMs that clearly show that plating baths containing the present mixture of leveling agents provide level deposits over a wide variety of aperture sizes with essentially no mounding. FIGS. 4A and 4B are SEMs that show that plating baths containing the present mixture of leveling agents and that are free of additional suppressors still provide relatively level deposits over a wide variety of aperture sizes.

Thus, electronic devices such as semiconductor devices, semiconductor packages, printed circuit boards and the like, are formed, according to the present invention having substantially planar copper layers and filled features that are substantially free of added defects, wherein the copper layer has not been subjected to polishing processes, such as a CMP process, electropolishing or simultaneous plating and planarization techniques. By "substantially planar" copper layer is meant that the step height, i.e., the difference between areas of dense very small apertures and areas free of or substantially free of apertures, is less than 1 μm, preferably less than 0.75 μm, more preferably less than 0.6 μm, and even more preferably less than 0.1 μm. "Substantially free of added defects" refers to the leveling agent mixture not increasing the number or size of defects, such as voids, in filled apertures as compared to control plating baths not containing such leveling agent mixture. A further advantage of the present leveling agent mixture is that a substantially planar metal layer may be deposited on a substrate having non-uniformly sized apertures, wherein the apertures are substantially free of added voids. "Non-uniformly sized apertures" refer to apertures having a variety of sizes in the same substrate. Thus, the need to tailor the leveling agent to the size of the feature to be filled is avoided.

EXAMPLE 1

Comparative

A copper plating bath was prepared by combining 40 g/L copper as copper sulfate, 10 g/L sulfuric acid, 50 ppm chloride ion, 10 mL/L of a brightener and 3 mL/L of a suppressor. The brightener was a disulfide compound having sulfonic acid groups and a molecular weight of <1000. The suppressor was an EO/PO copolymer having a molecular weight of <5,000 and terminal hydroxyl groups. The plating bath also contained 1 mL/L of a 1:1 reaction product of imidazole with epichlorohydrin as a single leveling agent. This reaction product had a polydispersity of <2.5 and a Mw of approximately 14,000.

A layer of copper was electroplated onto a wafer substrate by contacting a spinning wafer (200 RPM) with the above plating bath at 25° C. A current density of 60 mA/cm² was applied and a copper layer was deposited on each wafer to a thickness of approximately 1 μm. The copper layer was analyzed by atomic force microscopy using a conventional process and was found to have an arithmetic surface roughness ("Ra") of 14.3 nm and a height differential ("Z") of 161 nm. FIGS. 1A and 1B are SEMs of the copper layer and show mounding over 0.18 μm trenches and 2 μm trenches, respectively. The height of the mounding in FIGS. 1A and 1B is 1630 Å and 1610 Å, respectively.

EXAMPLE 2

Comparative

The procedure of Example 1 was repeated except that the leveler used was a 1:0.6 reaction product of imidazole with 1,4-butanediol diglycidyl ether ("BDE"), which is a diepoxy-functional compound having the formula

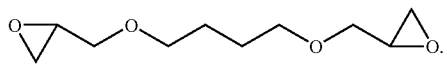

This reaction product had a polydispersity <2.5, a Mw of approximately 4,000, and was present in the plating bath in an amount of 6 mL/L.

The copper layer deposited from this plating bath was found by atomic force microscopy to have a Ra-value of 3.38 nm and a Z-value of 32.3 nm. FIGS. 2A and 2B are SEMs of the copper layer and show mounding over 0.18 μm trenches and 2 μm trenches, respectively. The height of the mounding in FIGS. 2A and 2B is 3830 Å and 4420 Å, respectively.

EXAMPLE 3

The procedure of Example 1 was repeated except a mixture of two leveling agents was used. The mixture of leveling agents contained 1 mL/L (based on the plating bath) of the 1:1 reaction product of imidazole with epichlorohydrin from Example 1 and 6 mL/L (based on the plating bath) of the 1:0.6 reaction product of imidazole with BDE from Example 2.

The copper layer deposited from this plating bath was found to have a Ra-value of 4.82 nm and a Z-value of 50.6 nm. FIGS. 3A and 3B are SEMs of the copper layer and show very little mounding over 0.18 μm and 2 μm trenches, respectively. The height of the mounding in FIGS. 3A and 3B is <500 Å and 860 Å, respectively.

The lower the value of Ra, the smoother the surface is. Lower values of Z indicate a more uniform surface height across the evaluated area. Thus, layers of copper having low Ra and Z-values are desired. As can be seen from the above data, plating baths having the present mixture of leveling agents provide very smooth surfaces, reduced mounding as compared to copper layers obtained from copper baths containing conventional single leveling agents, and copper deposits that are substantially void-free.

EXAMPLE 4

A copper plating bath was prepared by combining 40 g/L copper as copper sulfate, 10 g/L sulfuric acid, 50 ppm chloride ion, and 10 mL/L of a disulfide compound having sulfonic acid groups and a molecular weight of <1000 as a brightener. The plating bath also contained a leveling agent mixture composed of 1 mL/L of a 1:1 reaction product of imidazole with epichlorohydrin and 176 ppm of a 1:0.6 reaction product of imidazole with BDE, the leveling agent mixture having a polydispersity of ≧2.5. This plating bath did not contain any separately added suppressor compounds, such as EO/PO copolymers.

A layer of copper was electroplated onto a wafer substrate by contacting a spinning wafer (200 RPM) with the above plating bath at 25° C. A current density of 60 mA/cm² was applied with the wafer as the cathode and a copper layer was deposited on the wafer to a thickness of approximately 1 μm. The copper layer was analyzed by atomic force microscopy using a conventional process and was found to have an arithmetic surface roughness ("Ra") of 4.2 nm and a height differential ("Z") of 47 nm. FIGS. 4A and 4B are SEMs of the copper layer and show mounding over 0.2 μm trenches and 2 μm trenches, respectively. The height of the mounding in FIG. 4A is 650 Å. FIG. 4B shows slight dishing (2040 Å) over the trenches.

EXAMPLE 5

The procedure of Example 4 was used to deposit an approximately 400 Å thick copper layer on the surface of a wafer having 0.18 μm trenches with varying aspect ratios. Cross-sections of the wafer were analyzed by scanning electron microscopy to reveal that the low aspect ratio (AR=2.8) and high aspect ratio (AR=5.6) trenches were completely filled with no voids.

EXAMPLE 6

Imidazole (225 g) was dissolved in water (563 mL) in a reaction vessel. The mixture was heated to 80° C. with stirring. With continued stirring, 607.5 mL of a 60.8% solution of BDE in water was added to the reaction vessel at a rate of 82.7 mL/min. After the addition of the BDE, the temperature of the mixture was maintained at 95±3° C. for 5.5 to 6 hours with stirring. Following heating, the mixture was allowed to stir for 16-18 hours. The pH of the reaction product mixture was then set to a value of 6-7 using sulfuric acid. The reaction product was then transferred to a suitable container and diluted with DI water as needed.

What is claimed is:

1. A reaction product of an amine with a polyepoxide having a formula:

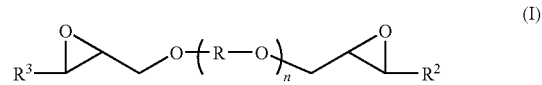

wherein R is $(C_1-C_{10})$alkyl; and $R^2$ and $R^3$ are independently chosen from H and R, wherein n=1-20.

2. The compound of claim 1, wherein the amine is chosen from dialkylamines, trialkylamines, diarylamines, imidazole, triazole, tetrazole, benzimidazole, benzotriazole, piperidine, morpholine, piperazine, pyridine, oxazole, benzoxazole, pyrimidine, quonoline and isoquinoline.

3. The compound of claim 1, wherein the polyepoxide is chosen from 1,4-butanediol, digylcidyl ether, ethylene glycol diglycidyl ether, diethylene glycol diglycidyl ether, triethylene glycol diglycidyl ether, glycerol diglycidyl ether, neopentyl glycol diglycidyl ether, propylene glycol diglycidyl ether, dipropylene glycol diglycidyl ether, and poly(propylene glycol) diglycidyl ether.

4. A metal plating bath containing the reaction product of claim 1.

* * * * *